HIGH GAIN SUPERREGENERATIVE DETECTORS

Filed Dec. 21, 1961

HERSHEL TOOMIM,
INVENTOR.

BY HIS ATTORNEYS.

Spensley & Horn

United States Patent Office 3,151,297
Patented Sept. 29, 1964

3,151,297
HIGH GAIN SUPERREGENERATIVE DETECTORS
Hershel Toomim, San Fernando, Calif., assignor to Electrosolids Corporation, Sylmar, Calif., a corporation of California
Filed Dec. 21, 1961, Ser. No. 161,086
6 Claims. (Cl. 325—429)

This invention pertains to radio detectors and more particularly to superregenerative detector circuitry.

Superregenerative detectors, as used in radio receivers for many years, combine fair sensitivity with simple circuitry and hence have found widespread use in high frequency applications where small size and low power consumption are important considerations. However, such detectors have the attendant disadvantages of poor selectivity and low output, and are critical of adjustment. The present invention is directed to the improvement of superregenerative detector circuitry and, more specifically, toward improvement of detector selectivity, sensitivity, and reproducibility.

Accordingly, it is an object of the present invention to provide improved superregenerative detector circuitry.

It is also an object of the present invention to provide very sensitive superregenerative detectors.

It is another object of the present invention to provide superregenerative detectors of high selectivity.

It is still another object of the present invention to provide improved superregenerative detectors the circuit constants of which are not overly critical, the detectors being suitable for quantity production by assembly line techniques.

It is a still further object of the present invention to provide very sensitive and selective superregenerative detectors which are easily adjustable.

The objects of the present invention are accomplished, in general, by providing a superregenerative detector with means for limiting the net electrical energy stored by the circuit per signal frequency cycle. More specifically, the net energy stored per cycle is limited by controlling the electrical energy supplied to the circuit per oscillation cycle. For example, in a self-quenched superregenerative detector the rate of oscillation build-up is controlled by selectively altering the quench circuit time constant during periods of signal amplification and detector oscillation.

The novel features which are believed to be characterisitc of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention. Furthermore, although specific embodiments of superregenerative detector circuitry are presented using vacuum tubes, the present invention concepts are equally applicable to transistorized superregenerative detector circuitry.

Figure 1:
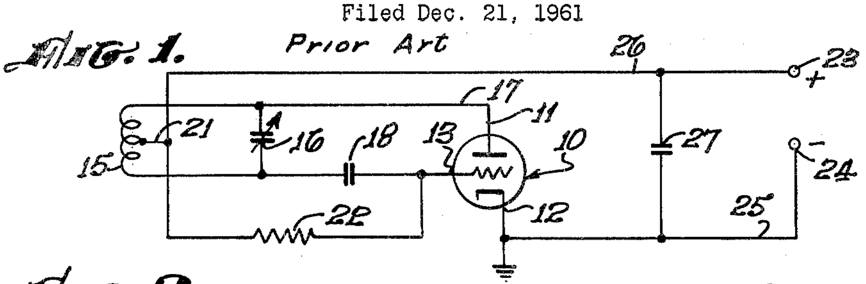
FIGURE 1 is a schematic diagram of a basic self-quenched superregenerative detector.

Turning now to the drawing, FIGURE 1 shows the schematic diagram of a typical vacuum tube superregenerative detector utilizing a triode tube indicated generally by the reference numeral 10. The triode 10 includes a plate 11, a cathode 12, and a control grid 13. One end of a parallel resonant tank circuit consisting of an inductor 15 and a variable capacitor 16 is connected to the plate 11 of the triode by an electrical lead 17. The other end of the tank circuit is coupled to the grid 13 of the triode 10 by a grid leak capacitor 18. The inductor 15 is provided with a center tap 21 which is connected to the grid 13 of the triode 10 by a grid leak resistor 22.

A pair of terminals 23 and 24 are provided for connection to a source of D.C. operating potential, polarized as shown with terminal 23 being the positive terminal and terminal 24 being the common or negative terminal. The negative terminal 24 is connected to the cathode 12 of the triode 10 by an electrical lead 25. The positive terminal 23 is connected to the center tap 21 of the inductance 15 by an electrical lead 26. A shunt capacitor 27 is connected between the electrical leads 25 and 26.

Figure 3:
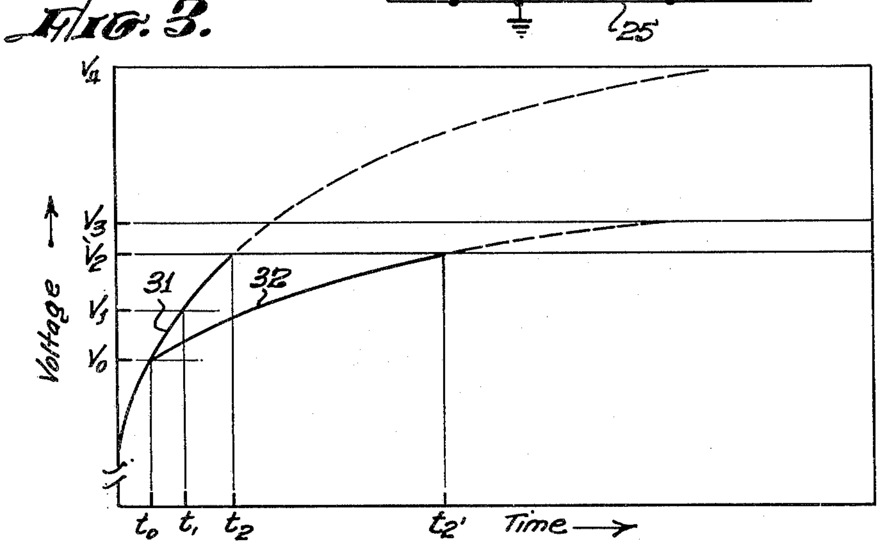
FIGURE 3 is a graph showing grid bias voltage as a function of time over a portion of a quench cycle for the superregenerative detectors of FIGURES 1 and 2.

A superregenerative detector is essentially an oscillating detector which is alternated between oscillating and non-oscillating conditions at a low R.F. rate. Generally, an alternating quenching voltage is utilized to interrupt the normal oscillation of a superregenerative detector. The detector itself can be made to furnish the quenching voltage, or a separate oscillator tube can be used. The illustrated embodiment of FIGURE 1 is of the self-quenching type, wherein the quench voltage is the charge which builds up across the grid leak capacitor 18 during periods of tube oscillation. In the absence of an input signal voltage, random noise will start the circuit oscillating at the radio frequency to which the tank circuit consisting of the inductor 15 and the capacitor 16 is tuned. As the circuit oscillates, a charge builds up across the grid leak capacitor 18 to produce a grid leak biasing effect which eventually cuts off the tube 10 and allows the oscillations to die out in accordance with the Q of the circuit. Upon cut-off of the current flow through the tube 10 the charge across the capacitor 18 leaks off through the grid leak resistor 22 at the exponential rate determined by the time constant, $T_1$, determined in accordance with the relationship $T=R_{22}C_{18}$ (the numerical subscripts indicating the reference numerals of the particular components as shown in FIGURE 1). Since the grid leak resistor 22 and capacitor 18 are returned to the cathode 12 of the tube 10 through the D.C. potential source connected across the terminals 23 and 24, discharge of the capacitor 18 will cause the grid potential of the triode tube 10 to exponentially increase toward the voltage of the D.C. potential source The grid bias voltage of the tube 10, which exponentially increases during a portion of each quench cycle in accordance with the discharge of the capacitor 18 back toward the supply voltage, is indicated by the curve 31 of the graph of FIGURE 3, wherein the grid voltage is plotted as a function of time for a preselected portion of a quench cycle. In the graph of FIGURE 3, the voltage $V_4$ indicates the magnitude of the D.C. supply voltage appearing at the terminal 23.

During the discharge of the capacitor 18 the increasing grid bias on the tube 10 reaches the value at which the tube is rendered conductive, and soon thereafter reaches a point whereupon oscillations again begin to build up. The point at which the tube 10 begins to conduct has been arbitrarily labeled in FIGURE 3 as the time $t_0$, with the corresponding voltage being indicated as $V_0$. The point at which the oscillations begin to build up, i.e., the point at which the loop gain reaches unity, is designated as the time $t_1$, with the corresponding voltage being indicated as $V_1$. The weak beginning cycles of oscillation build-up will be started by noise voltages present in the circuit and so the time at which the oscillations gain control of the circuit is determined in this instance by the prevailing noise levels in the circuit.

Upon beginning of oscillation, the oscillations build up at a rate in accordance with how much electrical energy is put into the circuit per oscillation cycle. The amount of electrical energy put into the oscillating circuit per cycle is determined by the transconductance of the tube 10. The transconductance of the tube 10 increases during circuit oscillation because of the exponential increase in grid bias voltage, so the oscillations build up at an increasing exponential rate controlled by the time constant of the detector quench circuit. As the oscillations rapidly build up, the aforementioned grid leak biasing effect again occurs to reduce the grid bias voltage on the tube 10 to cause cut-off of tube current flow and the dying out of the oscillations. In practice, the time constant of the quench circuit ($T=R_{22}C_{18}$) is ordinarily adjusted to provide a quench frequency on the order of 20–30 kc.

Assume now that a signal voltage is introduced into the circuit, the signal voltage being larger in magnitude than the thermal agitation noises in the circuit. Regenerative amplification of the signal voltage will occur from the onset of tube conduction to the point at which the loop again equals unity ($t_0$—$t_1$), at which point the circuit begins to oscillate. The initial amplitude of the oscillations will be determined by the amplitude of the superimposed signal at the time the loop gain reaches unit, rather than by the smaller amplitude of the noise voltages in the circuit. The oscillations will then build up at the aforementioned exponential rate and will reach their maximum value more quickly than before because of the larger initial amplitude. Hence, the presence of an input signal accordingly increases the average D.C. tube current.

When the loop gain reaches unity and the circuit rendered in an oscillatory state, the circuit will remain under the controlling influence of the signal voltage until the amplitude of the oscillations has built up to a value slightly in excess of the signal amplitude, at which time the oscillations gain control of the circuit and the signal voltage no longer has a controlling effect. In FIGURE 3, the voltage $V_2$ indicates the grid voltage at which the given signal ceases to have a controlling effect, the corresponding time being indicated by the symbol $t_2$. Therefore, the superregenerative detector will effectively be under the control of input signals during the time interval from the onset of tube conduction until the oscillations gain control of the circuit ($t_0$—$t_2$ for the given input signal), this time interval being designated the detector "on" time.

Starting at the time $t_2$ the amplitude of the oscillations rapidly exponentially builds up as does the charge on the capacitor 18, to thereby cause a reduction in the bias voltage applied to the tube 10. So at the time $t_2$ the grid bias voltage departs from the curve 31 and begins to decrease in accordance with the negative charge being built up across the grid leak capacitor 18, the grid bias voltage subsequent to the time $t_2$ not being shown. The projection of the curve 31 past the time $t_2$ is shown by a dotted line to illustrate the exponential nature of the curve.

When the amplitude of the oscillations reaches its maximum value there is no longer any current build-up and, due to the high bias on the tube, oscillations can no longer be sustained and the flow of current through the tube collapses and oscillations begin to die out, the grid bias voltage on the tube 10 at this point in time being much less than the magnitude of the voltage $V_0$ in FIGURE 3. As before, the cessation of current flow through the tube 10 allows the capacitor 18 to discharge through the grid leak resistor 22 in accordance with the exponential curve 31 of FIGURE 3, thereby initiating the next quench cycle.

Now if the magnitude of the input signal is increased, the initial amplitude of oscillation in the circuit will also be increased. The oscillations will therefore more quickly build up to their maximum value and the length of a quench cycle will be shorter than before. Hence, variations in signal amplitude result in changes in quench frequency because of the variation in oscillation build-up time. So the detector output varies in accordance with changes in quench frequency because the greater the quench frequency the greater the number of oscillatory pulses that occur per second and the greater the D.C. plate current of the tube 10. It thus becomes apparent that the performance of a self-quenched superregenerative detector can be improved by increasing the change in quench frequency resulting from a given change in signal amplitude. As explained hereinabove, during the time interval $t_0$—$t_2$, the circuit is under the controlling influence of a given applied signal, regenerative amplification occurring during the interval $t_0$—$t_1$ and controlled oscillation during the interval $t_1$—$t_2$. Now, if the time interval $t_0$—$t_2$ were to be lengthened for the given signal amplitude and without significantly changing the quench frequency, the detector "on" time would constitute a greater portion of the quench cycle and changes in input signal amplitude would then cause a greater variation in quench frequency, with a resulting increase in detector sensitivity and gain. Furthermore, while the circuit is still under the controlling influence of an applied signal the input signal determines the phase of the oscillations building up in the circuit. If the frequency of the input signal corresponds to the natural frequency of oscillation, the input signal aids in the build-up of oscillations; however, if the frequency of the input signal differs slightly from the oscillation frequency, then the signal can get out of phase with the oscillations and so delay their build-up. The longer the time interval during which the signal can get out of phase with the oscillations, the greater the phase controlling effect of the signal and, therefore, the greater the selectivity.

Figure 2:
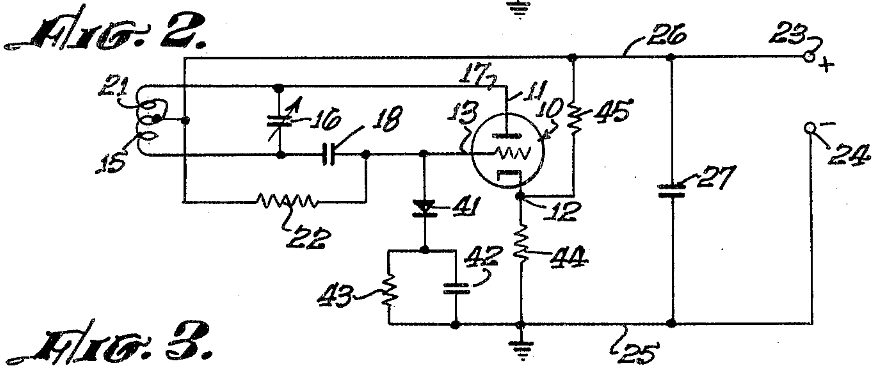
FIGURE 2 is a schematic diagram of an improved self-quenched superregenerative detector in accordance with one embodiment of the present invention.

The desired increase in detector "on" time without significant change in quench frequency can be accomplished in a self-quenched superregenerative detector by automatically, selectively lengthening the quench circuit time constant whenever the detector tube is in a conducting state, together with a lowering of the steady state value to which the quench voltage exponentially rises in accordance with the longer time constant. In FIGURE 2 of the drawing there is shown a schematic diagram of a self-quenched superregenerative detector incorporating this concept of limiting the electrical energy supplied to the circuit per oscillation cycle. The basic form of the detector circuitry is that shown in FIGURE 1 with like reference numerals indicating identical components throughout. In accordance with the hereinabove described concept of the present invention, the detector "on" time of the basic superregenerative detector circuit of FIGURE 1 has been increased, in a manner to be hereinafter explained, by the addition of a diode rectifier 41, a capacitor 42, and resistors 43, 44, and 45. The combination of the capacitor 42 and the resistor 43 is provided to modify the grid voltage curve 31 of FIGURE 3 when this combination is switched into the quench circuit by conduction of the diode 41. The capacitor 42 and the resistor 43 are connected in parallel with one end of the parallel combination being connected to the negative terminal 24 of the D.C. supply voltage source and the other end being connected to the cathode terminal of the rectifier 41. The anode terminal of the rectifier 41 is electrically connected to the grid 13 of the triode tube 10. One end of the resistor 44 is connected to the ground lead 25 and the other end of the resistor 44 is connected to the cathode 12 of the tube 10. One end of the resistor 45 is connected to the cathode 12 of the tube 10 and the other end of the resistor 45 is connected to the positive D.C. voltage terminal 23 through the electrical lead 26. The series combination of the resistors 44 and 45 form a voltage dividing network to provide cathode bias for the triode tube 10 to affect the conduction periods of the rectifier 41 in a manner to be hereinafter explained.

The operation of the improved superregenerative detector circuitry of FIGURE 2 will now be explained with reference to the graph of FIGURE 3, assuming for the purposes of explanation that the voltages $V_0$, $V_1$, $V_2$ and $V_4$ and the referenced times $t_0$, $t_1$ and $t_2$ are equally applicable to the circuit of FIGURE 2. The application of FIGURE 3 to both of FIGURES 2 and 1 enables a direct comparison of the circuits under identical signal input conditions. Referring now to the time interval between the time origin and $t_0$, the tube 10 is cut off and the diode rectifier 41 is reversed biased due to the potential difference between the grid of the tube 10 and the charge on the capacitor 42, the high reverse resistance of the rectifier effectively removing the capacitor 42 and the resistor 43 from the quench circuit. Hence, the grid voltage on the tube 10 is rising at the exponential rate determined by the discharge of the capacitor 18 in accordance with the curve 31 of FIGURE 3. The resistance values of the resistors 44 and 45 are chosen so that the diode rectifier 41 will begin conducting when the grid voltage on the tube 10 is equal to the cutoff value $V_0$. Hence, at the time $t_0$ when the tube begins conducting, conduction of the diode rectifier 41 effectively switches the capacitor 42 and the resistor 43 into the quench circuit, the low forward resistance of the diode rectifier 41 being considered negligible with respect to the resistance of the resistor 43. So at the time $t_0$ the grid voltage of the tube 10 no longer continues to rise at the exponential rate of the curve 31 but begins to rise at a new slower exponential rate in accordance with the increased time constant of the quench circuit caused by the insertion into the quench circuit of the capacitor 42 and the resistor 43. This new time constant, $T_2$, is determined by the resistances of the resistors 22 and 43 and the capacitances of the capacitors 18 and 42 in accordance with the relationship $$T=\frac{R_{22}R_{43}}{R_{22}+R_{43}}(C_{18}+C_{42})$$

where the numerical subscripts again refer to the reference numerals of the particular components as shown in the drawing. This new exponential rate of grid voltage rise is shown by the line 32 in FIGURE 3 beginning at the time $t_0$ and the voltage $V_0$ and increasing at a much slower rate than the curve 31. The steady state value to which the quench voltage exponentially rises in accordance with the curve 32 is designated in FIGURE 3 as $V_3$. This asymptotic value $V_3$ is that portion of the supply voltage $V_4$ determined by the relationship $$V_3=V_4\left(\frac{R_{43}}{R_{22}+R_{43}}\right)$$

In practice, the resistance value of the resistor 22 is determined in accordance with the usual superregenerative design considerations, and the resistance value of the resistor 43 then chosen to set the voltage $V_3$ in the high transconductance region of the tube 10. The capacitance value of the capacitor 42 is then chosen to provide the desired slower time constant in conjunction with the capacitance value of the capacitor 18 and the resistance values of the resistors 42 and 43. In practice the time constant $T_2$ can be conveniently made as much as five times the time constant $T_1$. By proper selection of resistance and capacitance values the net circuit time constant (the average time constant throughout an entire quench cycle) can be adjusted to provide approximately the same quench frequency as the original circuit of FIGURE 1.

As pointed out hereinabove, the rate of oscillation build-up is determined by the transconductance of the tube 10, which controls the amount of energy put into the circuit during each oscillation cycle. By lengthening the quench circuit time constant during periods of tube conduction together with a lowering of the steady state voltage which the grid vias voltage curve asymptotically approaches, the rate of grid bias change is significantly decreased, as can be seen by comparing the curves 31 and 32 of FIGURE 3. By slowing down the rate of grid bias increase, the rate of increase of tube transconductance is also slowed down, thereby decreasing the rate of oscillation build-up because the tube is held longer in a lower transconductance region. Since the circuit is then kept in a weakly oscillating condition for a longer period of time, the circuit sensitivity has been increased because it now takes longer for the build-up of oscillations to overcome the influence of a given signal. It has been found that there is an approximate correlation between the exponential rate of grid bias increase and the exponential rate of oscillation build-up such that the oscillations gain control of the circuit from a given signal at approximately the same value of grid bias voltage. Accordingly, upon changing of the grid bias voltage build-up from the curve 31 to the more gradual curve 32 the coordinates of the point at which the oscillations have built up to a sufficient value to enable them to attain circuit control are $V_2$, $t_2'$. It is therefore seen that the detector "on" time has been increased from the former value $t_0-t_2$ to the new larger value $t_0-t_2'$. At the time $t_2'$ the grid voltage of the tube 10 has reached the value $V_2$ and, as discussed hereinabove, at this particular point the input signal ceases to have a controlling effect and the circuit is then controlled by the rapidly rising amplitude of the oscillations.

As before the rapid increase in the amplitude of the oscillations causes a reduction in the grid bias voltage on the tube 10 followed by tube cutoff and the subsequent decay of oscillations. So at the time $t_2'$, the grid bias voltage departs from the curve 32 and begins to decrease in accordance with the charge build-up across the capacitors 18 and 42 until the grid voltage decreases to the value $V_0$ at which time the rectifier 41 ceases to conduct and so effectively isolates the capacitor 42 from the quench circuit. The projection of the curve 32 past time $t_2'$ is shown by a dotted line to illustrate the exponential nature of the curve, the actual grid bias voltage subsequent to the time $t_2'$ not being shown. When the bias voltage on the tube 10 decreases to the voltage $V_0$, the rectifier 41 again becomes reverse biased and its high reverse resistance then effectively removes the parallel combination of the capacitor 42 and the resistor 43 from the quench circuit. Upon cutoff of tube 10, the capacitor 18 then begins to discharge through the grid leak resistor 22 and the source of D.C. potential to initiate the next succeeding quench cycle. A study of FIGURE 3 shows that the detector "on" time has been appreciably lengthened thereby providing the desired increase in detector performance.

Figure 4:
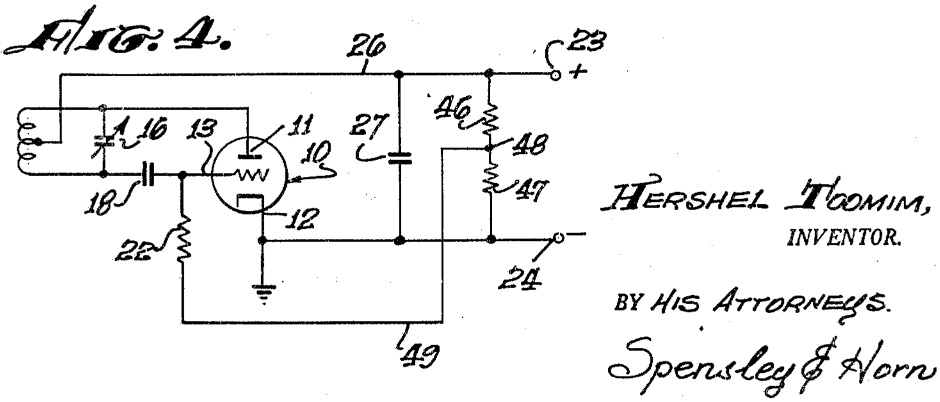
FIGURE 4 is a schematic diagram of an improved self-quenched superregenerative detector circuit in accordance with an alternative embodiment of the present invention.

In view of the preceding expository discussion, it becomes apparent that a lengthening of the detector "on" time can be accomplished in the basic prior art self-quenched superregenerative detector circuitry by merely decreasing the steady state value of voltage to which the exponential grid bias voltage curve 31 in FIGURE 3 asymptotically approaches, and without alteration of the quench circuit time constant. The schematic diagram of FIGURE 4 shows such an embodiment, again based on the circuit of FIGURE 1 and with like reference numerals indicating identical components throughout. In FIGURE 4, a resistance voltage dividing network consisting of series-connected resistors 46 and 47 is connected across the supply voltage terminals 23 and 24. The grid leak resistor 22 is returned to the junction 48 of the resistors 46 and 47 (instead of directly to the positive terminal 23 as it was in FIGURE 1) by an electrical lead 49. Hence, in the circuit of FIGURE 4, the grid bias voltage curve will not asymptotically approach the supply voltage ($V_4$) but will asymptotically approach a lower potential determined by the relative resistances of the resistors 46 and 47, the actual value being approximately $$V_4\left(\frac{R_{47}}{R_{46}+R_{47}}\right)$$

Although this simple method of lengthening detector "on" time will also yield a significant increase in detector gain, the amount of gain will be sensitive to changes in supply voltage. Furtermore, because of differences in the actual resistance values between supposedly identical resistors due to the usual permissible manufacturing tolerances, each detector would have to be individually adjusted to provide the same gain and performance characteristics. On the other hand, the performance characteristics of the circuit of FIGURE 2 are relatively insensitive to changes in supply voltage and the circuit itself automatically sets the gain at the proper level. Hence, the circuitry of FIGURE 2 can be conveniently reproduced on a mass production basis with substantially identical performance characteristics.

Although the hereinabove described illustrative embodiments are superregenerative detectors of the self-quenched type, the present invention concept of controlling the net stored energy per cycle is applicable to any type of superregenerative detector wherein the energy put into the circuit per cycle can be altered. For example, in superregenerative detectors of the type deriving the quench voltage from a separate oscillator the waveform of the quench oscillator can be controlled by selectively, intermittently lowering the Q of its tank circuit to thereby slow down the rate of oscillation build-up. Such a lowering of tank circuit Q can be accomplished by utilizing a diode limiter to automatically periodically shunt a damping impedance across the oscillator tank circuit. Other methods of applying the present invention concepts to superregenerative detectors will become apparent to those skilled in the art. Hence, although the present invention has been described with a certain degree of particularity, it is understood that the present disclosure has been made only by way of example and that numerous changes in circuitry details and the combination and arrangement of parts may be resorted to without departing from the spirit and the scope of the invention as hereinafter claimed.

What is claimed is:

1. In a self-quenched superregenerative detector powered from a source of direct-current operating potential and having its normal quench frequency determined in accordance with the time constant formed by the product of a quench resistance and a quench capacitance and wherein said quench capacitance discharges during a portion of each quench voltage cycle in accordance with an exponential curve which asymptotically approaches the direct-current operating potential applied to the detector, the improvement comprising means for simultaneously, selectively only during the periods of signal detection and detector oscillation in each quench cycle, lengthening the quench circuit time constant and lowering the steady state potential toward which the exponential discharge curve of said quench capacitance asymptotically approaches to a predetermined constant value less than said applied direct-current operating poential, said means comprising an impedance and switching circuit series connected with said quench resistance across said source of direct-current operating potential, said impedance and switching circuit consisting of a shunt combination of resistance and capacitance in series with a unilaterally conductive device biased for conduction only during said periods of signal detection and detector oscillation.

2. In a self-quenched superregenerative detector powered from a source of direct-current operating potential and having its normal quench frequency determined in accordance with the time constant formed by the product of a quench resistance and a quench capacitance and wherein said quench capacitance discharges during a portion of each quench voltage cycle in accordance with an exponential curve which asymptotically approaches the direct-current operating potential applied to the detector, the improvement comprising means for simultaneously, selectively only during the periods of signal detection and detector oscillation in each quench cycle, lengthening the quench circuit time constant and lowering the steady state potential toward which the exponential discharge curve of said quench capacitance asymptotically approaches to a predetermined constant value less than said applied direct-current operating potential, said means comprising an impedance and switching circuit series connected with said quench resistance across said source of direct-current operating potential, said impedance and switching circuit including the series combination of a predetermined impedance and a unilaterally conductive device biased for conduction only during said periods of signal detection and detector oscillation.

3. In a self-quenched superregenerative detector powered from a source of direct-current operating potential and having its normal quench frequency determined in accordance with the time constant formed by the product of a quench resistance and a quench capacitance and wherein said quench capacitance discharges during a portion of each quench voltage cycle in accordance with an exponential curve which asymptotically approaches the direct-current operating potential applied to the detector, the improvement comprising means for simultaneously, selectively only during the periods of signal detection and detector oscillation in each quench cycle, lengthening the quench circuit time constant and lowering the steady state potential toward which the exponential discharge curve of said quench capacitance asymptotically approaches to a predetermined constant value less than said applied direct-current operating potential, said means comprising an impedance and switching circuit series connected with said quench resistance across said source of direct-current operating potential, said impedance and switching circuit including a unilaterally conductive device biased for conduction only during said periods of signal detection and detector oscillation.

4. In a self-quenched superregenerative detector powered from a source of direct-current operating potential and having its normal quench frequency determined in accordance with the time constant formed by the product of a quench resistance and a quench capacitance and wherein said quench capacitance discharges during a portion of each quench voltage cycle in accordance with an exponential curve which asymptotically approaches the direct-current operating potential applied to the detector, the improvement comprising means for simultaneously, selectively only during the periods of signal detection and detector oscillation in each quench cycle, lengthening the quench circuit time constant and lowering the steady state potential toward which the exponential discharge curve of said quench capacitance asymptotically approaches to a predetermined constant value less than said applied direct-current operating potential, said means comprising an impedance and switching circuit series connected with said quench resistance across said source of direct-current operating potential.

5. In a self-quenched superregenerative detector including an electrical translating element having an input electrode and an output electrode and a common electrode, said detector being powered from a source of direct-current operating potential, said detector having its normal quench frequency determined in accordance with the time constant formed by the product of a quench resistance and a quench capacitance, said quench capacitance being connected to the input electrode of said electrical translating element whereby the varying charge on said quench capacitance provides a quench voltage at said input electrode to periodically bias said electrical translating element sufficiently to cut off the flow of output current therethrough thereby periodically interrupting detector oscillation, the improvement comprising means for slowing down the rate of change of the charge on said quench capacitance during the periods of electrical translating element cutoff and signal detection in each quench voltage cycle to thereby slow down the rate of increase of the transconductance of said electrical translating element during the period of signal detection during each quench voltage cycle, said means consisting of a voltage dividing network connected across said source of direct-current operating potential, and means connecting said quench capacitance across a predetermined portion of said voltage dividing network so that the steady state D.C. potential applied to said quench capacitance is less than the D.C. operating potential applied to said detector yet is sufficient to enable operation of said electrical translating element in its high transconductance region during a portion of each quench cycle to achieve detector oscillation and superregenerative action.

6. In a self-quenched superregenerative detector including an electrical translating element having an input electrode and an output electrode and a common electrode, said detector being powered from a source of direct-current operating potential, said detector having its normal quench frequency determined in accordance with the time constant formed by the product of a quench resistance and a quench capacitance, said quench capacitance being connected to the input electrode of said electrical translating element whereby the varying charge on said quench capacitance provides a quench voltage at said input electrode to periodically bias said electrical translating element sufficiently to cut off the flow of output current therethrough thereby periodically interrupting detector oscillation, means connecting said quench capacitance and said quench resistance across a source of direct-current potential of a value less than the D.C. operating potential applied to said detector yet great enough to enable operation of said electrical translating element in its high transconductance region during a portion of each quench cycle to achieve detector oscillation and superregenerative action, to thereby slow down the rate of change of the charge on said quench capacitance during the periods of electrical translating element cutoff and signal detection in each quench voltage cycle.

References Cited by the Examiner

UNITED STATES PATENTS

| | | | |
|---|---|---|---|
| 2,410,768 | 11/46 | Worchester et al. | 325—428 |
| 2,644,080 | 6/53 | Richman | 325—429 |
| 2,851,685 | 9/58 | Hollman | 325—429 |
| 2,863,995 | 12/58 | Chow | 329—170 |
| 2,992,327 | 7/61 | Lennon et al. | 325—429 |
| 3,025,394 | 3/62 | Durkee | 325—429 |

DAVID G. REDINBAUGH, *Primary Examiner.*